United States Patent [19]
MacPherson

[11] Patent Number: 5,858,500
[45] Date of Patent: Jan. 12, 1999

[54] TAMPER RESPONDENT ENCLOSURE

[75] Inventor: Hugh MacPherson, Milnathort, United Kingdom

[73] Assignee: W. L. Gore & Associates, Inc., Newark, Del.

[21] Appl. No.: 522,316

[22] PCT Filed: Mar. 10, 1994

[86] PCT No.: PCT/GB94/00464

§ 371 Date: Apr. 8, 1996

§ 102(e) Date: Apr. 8, 1996

[87] PCT Pub. No.: WO94/20935

PCT Pub. Date: Sep. 15, 1994

[30] Foreign Application Priority Data

Mar. 12, 1993 [GB] United Kingdom .................. 9305083

[51] Int. Cl.⁶ ...................................... B32B 9/00
[52] U.S. Cl. .............................. 428/68; 428/76; 428/121; 428/124; 428/126; 428/128; 428/131; 428/133; 428/137; 428/192; 428/916; 264/259; 264/267; 264/271.1; 264/272.11; 380/3; 340/541; 340/568

[58] Field of Search ...................................... 428/121, 124, 428/125, 126, 916, 245, 915, 128, 131, 133, 195, 137, 192, 68, 76; 380/9, 3, 4, 50; 340/541, 568; 264/259, 267, 271.1, 279, 272.11, 272.14, 272.21

[56] References Cited

U.S. PATENT DOCUMENTS 5,049,704  9/1991  Matouschek ............................ 174/261

FOREIGN PATENT DOCUMENTS

| 598272 | 1/1988 | Australia . |
|---|---|---|
| 0347209 | 12/1989 | European Pat. Off. . |
| 0526066 | 2/1993 | European Pat. Off. . |
| 2108302 | 5/1983 | United Kingdom . |
| 2174830 | 11/1986 | United Kingdom . |
| 0284351 | 9/1988 | United Kingdom . |
| 2220513 | 1/1990 | United Kingdom . |
| 2256958 | 12/1992 | United Kingdom . |

Primary Examiner—William Krynski
Assistant Examiner—Abraham Bahta
Attorney, Agent, or Firm—Gary A. Samuels

[57] ABSTRACT

The method is disclosed for producing a tamper respondent enclosure (10). A flexible tamper respondent laminate (32) is folded to define an inner enclosure (26) which is then potted within an outer enclosure in the form of a molding (28).

25 Claims, 4 Drawing Sheets

TAMPER RESPONDENT ENCLOSURE

FIELD OF THE INVENTION

This invention relates to a tamper respondent enclosure, and also to a method of producing a tamper respondent enclosure.

BACKGROUND OF THE INVENTION

Tamper respondent enclosures are utilised in various applications, including the transport of sensitive information and protecting electronic devices. Examples of various proposals for such enclosures are disclosed in our earlier patent application nos. GB 2 220 513 A, GB 2 258 075 A, GB 2 256 956 A, GB 2 256 957 A, GB 2 256 958 A, and GB 2 270 785 A the disclosures of which are incorporated herein by reference. These enclosures are in the form of envelopes and shallow boxes, the walls of which are formed by folding flexible sheets incorporating tamper detection features. Included in such sheets are layers of flexible material including a matrix of diagonally extended semi-conductive lines printed on thin insulating film. The matrix of lines forms a continuous conductor which is broken if attempts are made to penetrate the film. The circuit is monitored by opening the conductor at one point and measuring the resistance between the two ends of the circuit. Care is required to maintain security at the portions of the sheet which are folded and overlapped, particularly when the enclosure is of wedge-shaped, cuboid or cube form, such as disclosed in GB 2 258 075 A in which a laminate is folded about a plurality of fold lines to form an enclosure. The formation of secure folds and overlapping portions is addressed in 2270785, in which various extensions are provided on a substantially rectangular sheet to assure security at the folded and overlapping portions.

While such arrangements provide secure enclosures, the formation of the enclosures requires great care and thus is relatively time consuming.

Other tamper respondent enclosures and elements are disclosed in GB-A-2 174 830, GB-A-2 108 302, EP-A-0 284 351 and U.S. Pat. No. 5,049,703.

Another form of enclosure is disclosed in U.S. Pat. No. 4,860,351, assigned to IBM Corporation. This enclosure features an electronic circuit card wrapped in a closely spaced coil of insulated conductor such as $^{35}/_{10,000}$ths inch nichrome wire. The wire is monitored and breaks in or displacement of the wire due to tampering are detected. The wire-wrapped card is potted in an opaque, cross-linked filled epoxy. The wire is relatively fragile, so attempts to displace it will likely result in breaking the conductor. Also, bypassing a portion of the conductor is difficult because it is difficult to attach to the wire.

Providing a complete wire barrier around a card typically requires one or more kilometers of wire, and the wire winding operation is therefore time consuming and complicated if the wire is to be wrapped in anything other than a very simple pattern. Further, the use of such fragile wire often results in breakages during the winding operation, resulting in high levels of scrapped enclosures.

In addition, the wire barrier comprises four separate strands which are wound simultaneously onto the enclosure, and the outside ends then tied together to form a single enclosure. The tied ends are then tucked beneath the surface of the winding. It would seem likely that this tucking could result in damage to the fragile wire, and also if it was possible to locate and 'untuck' the tied ends it might well be possible to unwind the strands.

Australian Patent 598272 (AU-B-74241/87) discloses an electronic memory protection guard which is intended to obviate a number of the difficulties associated with such wound wire barriers. The guard comprises a flexible printed circuit adapted to be folded around the device to be protected. It is suggested that the device and flexible circuit may then be encapsulated in epoxy. In the disclosed example the edges of the printed circuit do not overlap, such that during encapsulation the uncured epoxy could flow between the edges to contaminate the protected device. Also, as the epoxy provides no tamper detection facilities it would be relatively easy to remove areas of epoxy from the printed circuit and then separate the edges of the circuit to gain access to the protected device.

It is among the objects of the present invention to obviate or mitigate these disadvantages.

SUMMARY OF THE INVENTION

According to one aspect of the present invention there is provided a method of producing a tamper respondent enclosure comprising the steps of:

providing a sheet of flexible material incorporating tamper respondent means;

folding the sheet and overlapping the edges thereof to define an inner enclosure;

surrounding the inner enclosure with a layer of fluid material; and hardening the fluid material to provide a solid outer enclosure adhered to the inner enclosure.

According to a further aspect of the present invention there is provided a tamper respondent enclosure comprising:

a sheet of flexible material incorporating tamper respondent means, the sheet being folded and the edges of the sheet overlapped to define an inner enclosure; and a unitary outer enclosure adhered to and encapsulating the inner enclosure.

During forming, the fluid material will flow into any gaps or spaces between overlapping portions of the folded sheet to provide a more secure enclosure. The use of a fluid material also leads to an enclosure having a smoother outer surface with no delicate flaps or edges exposed, which is thus less susceptible to accidental damage during normal handling. With careful application the hardened fluid layer will provide an environmental seal against damp and the like. Also, it is preferred that the outer enclosure is sufficiently thick and opaque to conceal the location of the folds and seams of the inner enclosure, and also conceals the exact location of the inner enclosure within the outer enclosure; the variances in such a process will lead to each security enclosure produced in this way each having the inner enclosure located slightly differently within the outer enclosure, making accurate location of the inner enclosure, and unauthorised penetration of the enclosure, more difficult.

Preferably, the fluid material is initially contained in a mould around the inner enclosure. This allows the form and dimensions of the enclosure to be closely controlled and facilitates the formation of, for example, windows or mounting lugs in the outer enclosure. Further, tamper evident patterns, user information, warnings, trademarks and the like may be formed easily in the outer surface of the enclosure during moulding.

Preferably also, the fluid material hardens at a relatively low temperature, to minimise the possibility of heat damage to the inner enclosure and articles contained within the enclosure. A cold pour polyurethane system has been found to be suitable, and also has the advantage of a relatively short cure time.

Preferably also, the outer enclosure is resilient on hardening. This provides for robustness in normal handling conditions and allows clamping of the enclosure in location without the requirement to provide additional protection. The polyurethane system described above provides such properties, having a Shore hardness of 70.

Preferably also, the tamper respondent means includes a delamination respondent layer on at least one side of the flexible sheet. Most preferably, the sheet is folded such that the layer is presented on the outer surface of the inner enclosure, and the adhesion between the layer and the outer enclosure is greater than the adhesion between the layer and the flexible sheet. Thus an attempt to peel back the outer enclosure from the inner enclosure will result in the delamination respondent layer being pulled away from the inner enclosure. The delamination respondent layer preferably includes a line of electrically responsive material, an electrical characteristic of which is monitored. Examples of suitable layers are described in our earlier patent applications numbers GB 2 220 513 A, GB 2 258 075 A, GB 2 256 956 A, GB 2 256 957 A, GB 2 256 958 A, and GB 2 270 785 A.

Preferably also, means are provided for monitoring the electrically responsive line and said means are located within the enclosure. The connection members provided between said means and the line are preferably provided at an edge portion of the sheet provided with connecting locations for the line, such as described in our earlier application number GB 2 256 957 A. Most preferably, the connection members extend parallel to said edge. This facilitates location of the connecting locations at a simple unfolded seam of the folded sheet, simplifying folding of the sheet and minimising the possibility of damage to the connecting locations during folding.

Preferably also, the sheet includes a layer provided to detect piercing and attempted penetration of the enclosure using elevated temperature cutting means, such as a laser. Most preferably, this laser and pierce respondent layer includes tracks of electrically responsive material on opposite sides of an electrically insulating sheet. The tracks are monitored and an attempt to penetrate the layer results in one or more of the tracks being cut to produce a detectable change in a monitored electrical characteristic of the tracks. Examples of such layers are described, for example, in our earlier patent application number GB 2 270 785 A, in which the tracks on each side of a sheet extend in parallel and are of a width and pitch such that piercing of the layer at any point results in damage to at least one of the tracks. Most preferably, each track is nonrectilinear, for example defining a sawtooth or wave pattern. In prior proposals, such as described in the above noted patent application, the tracks in each layer are rectilinear and codirectional and thus require the provision of two layers to guard against the cutting of narrow slots parallel to the tracks. However, with the provision of nonrectilinear tracks, only a single layer is required as any attempt to cut a slot of any length will result in tracks being crossed and cut. Also, with nonrectilinear tracks, it is very difficult to determine the direction of the tracks at any point on the layer.

According to a still further aspect of the present invention there is provided a tamper respondent enclosure having a wall including a laser and pierce respondent layer including nonrectilinear tracks of electrically responsive material on opposite sides of an electrically insulating sheet, and means for monitoring an electrical characteristic of the tracks, an attempt to penetrate the layer resulting in one or more of the tracks being cut to produce a detectable change in a monitored electrical characteristic of the tracks.

These and other aspects of the present invention will now be described, by way of example, with reference to the accompanying drawings, in which:

DETAILED DESCRIPTION OF THE INVENTION

Figure 1:
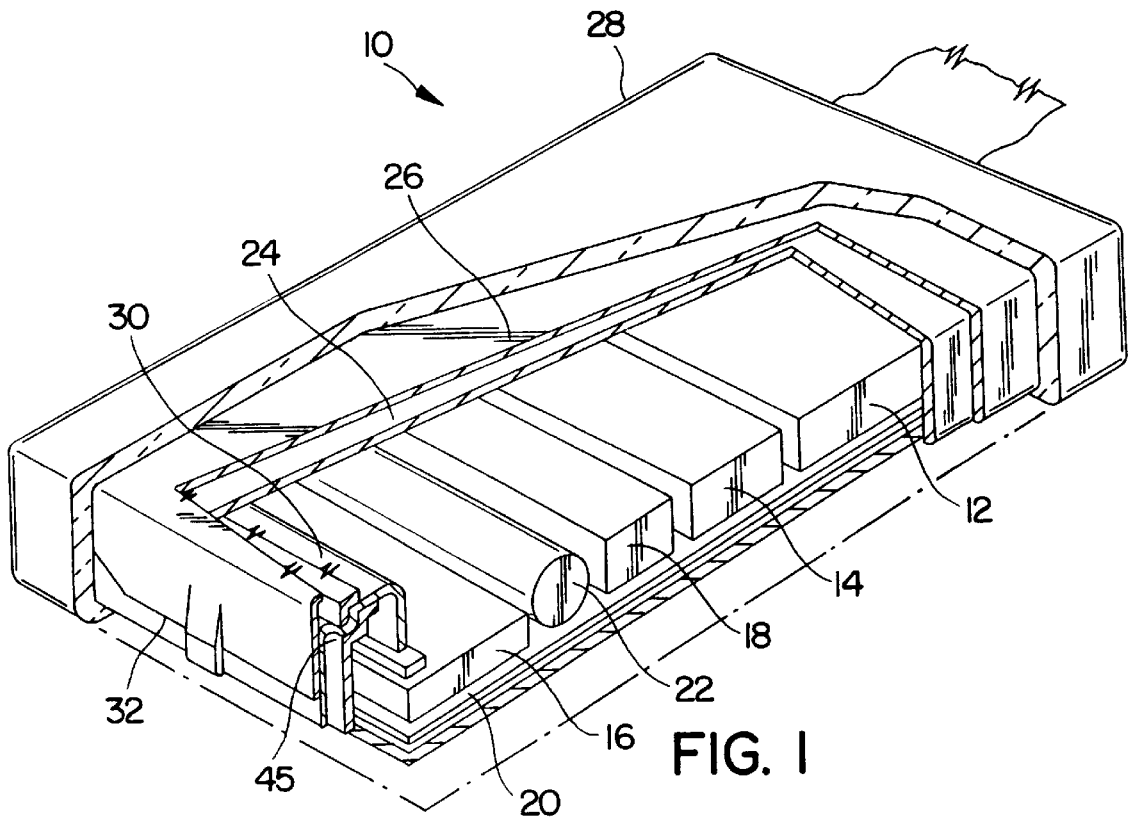
FIG. 1 is a perspective part cut-away view of a tamper respondent enclosure in accordance with a preferred embodiment of the present invention.

Reference is first made to FIG. 1 of the drawings, which illustrates a tamper respondent enclosure 10 in accordance with a preferred embodiment of the present invention. The enclosure 10 carries security sensitive information in an encryption module 12, access to the information stored in the module 12 requiring use of a variable key, the nature of the key required being stored in a memory 14. As will be described, the enclosure is arranged to detect attempts to tamper with or penetrate the enclosure and accordingly contains an enclosure monitor 16 which, if tampering is detected, activates an erase circuit 18 to erase the information stored in the memory 14 and encryption module 12. These components are mounted on and interconnected by a printed circuit board 20, power being provided by a single battery 22.

The walls of the enclosure 10 comprise three primary components: an enclosure 24, preferably of metal; an inner enclosure 26 in the form of a folded tamper respondent laminate 32; and an outer enclosure in the form of a moulding 28. As will be described, the tamper respondent laminate 32 includes various detection layers which are monitored, via a ribbon cable 30, by the enclosure monitor 16. The metal enclosure 24 provides physical protection against sudden violent attempts to penetrate the enclosure 10 and disengage the enclosure monitor 16 or erase circuit 18 before information can be erased from the encryption module 12.

Figure 2:
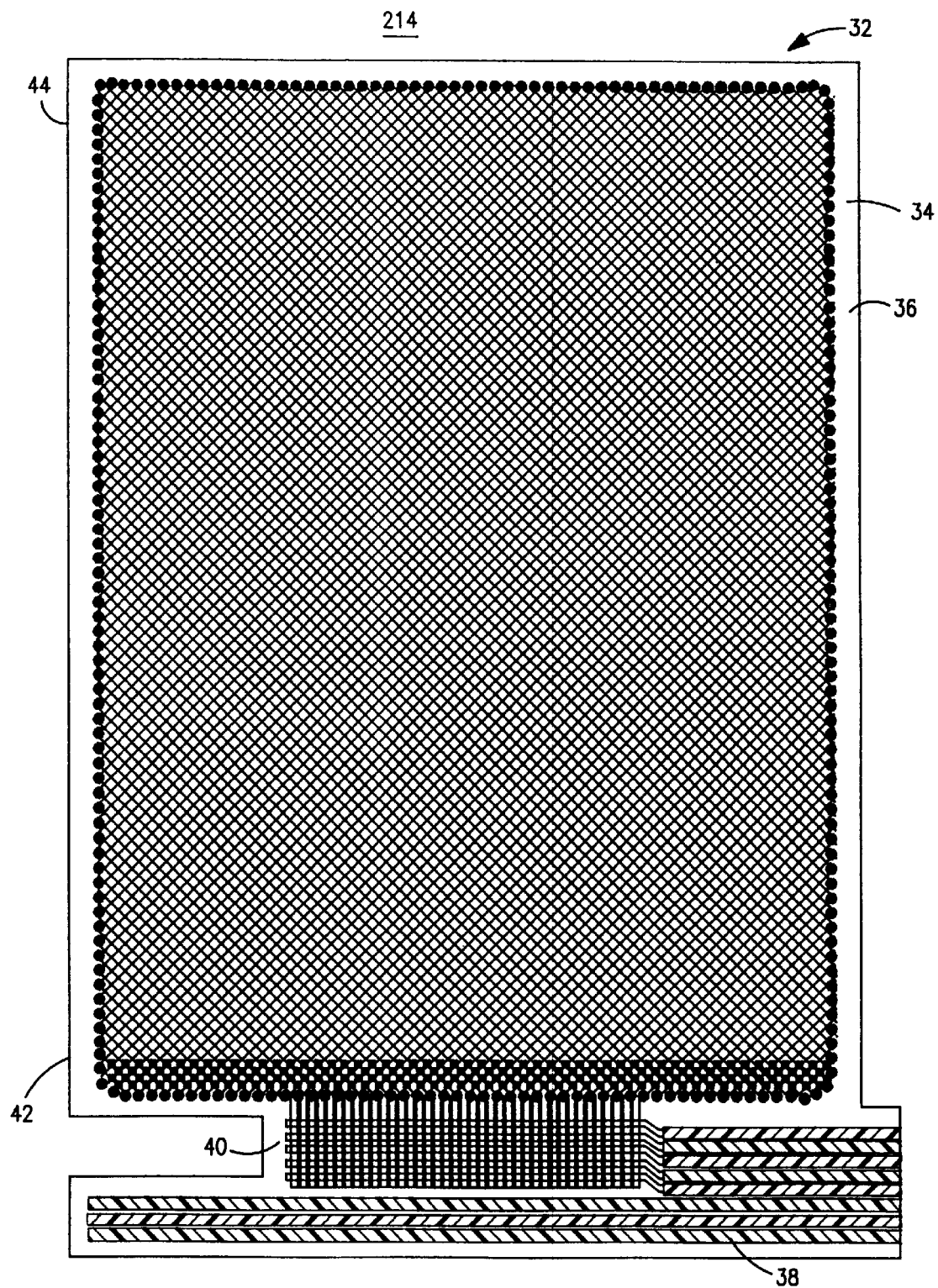
FIG. 2 is a plan view of a layer of the tamper respondent laminate of the enclosure of FIG. 1.

The tamper respondent laminate 32 is initially planar, as illustrated in FIG. 2 of the drawings. The laminate is formed of a number of separate layers, the outermost delamination respondent layer including a matrix 34 of diagonally extending semi-conductive lines printed onto a rectangular, thin insulating film 36. The matrix of lines 34 forms a number of continuous conductors which will be broken if attempts are made to penetrate the film 36. A detailed description of such a layer is contained in our earlier patent application no. GB 2 256 957 A. The lines are formed by printing carbon loaded polyester ink onto the film 36 and selectively connecting the lines on each side at the edges of the film. Connections between the lines and the enclosure monitor 16 are provided by the ribbon cable 30, which is itself formed of further lines 38 of carbon loaded ink printed onto an extension of the film 36. The connections between the matrix 34 and the cable 30 are made via connectors 40 formed on one edge 42 of the film 36. When the laminate 32 is folded to define the inner enclosure 26 the edge 42 is overlapped with the opposite edge 44 to form a seam in such a manner that the connectors 40 are contained within the enclosure 26. This allows the cable to pass from the underside of the enclosure 26 (as viewed in FIG. 1), though a labyrinth cable entry 45 in the metal enclosure 24, to the monitor 16.

Figure 4:
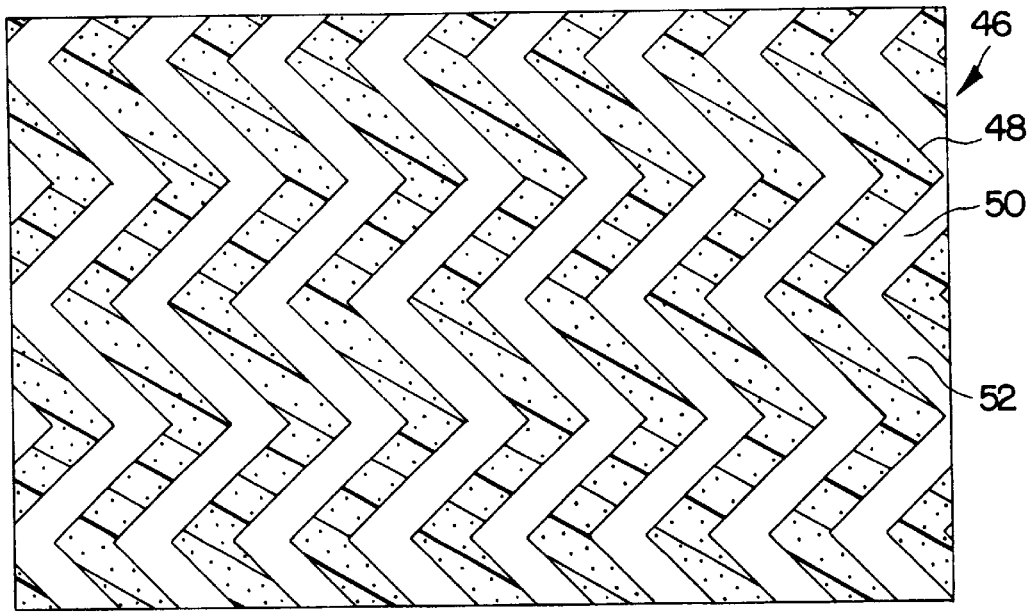
FIG. 4 is a portion of a further layer of the tamper respondent laminate of the enclosure of FIG. 1, shown greatly enlarged.
Figure 3:
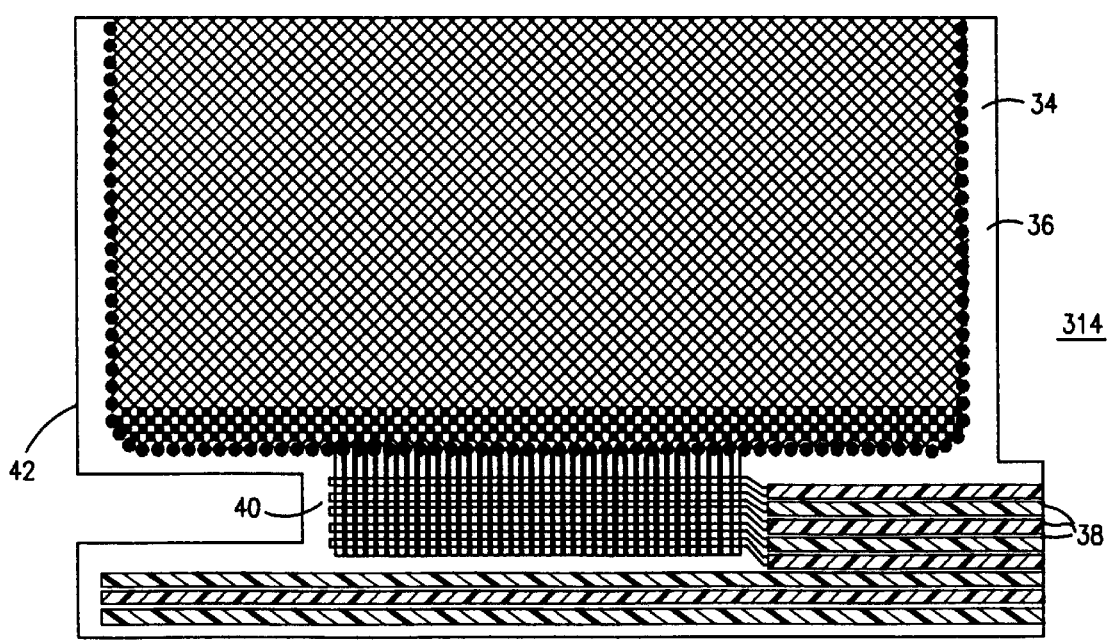
FIG. 3 is an enlarged view of a portion of the layer of FIG. 2.

The laminate 32 further includes a laser and pierce respondent layer and a portion of this layer 46 is illustrated in FIG. 4 of the drawings. The layer 46 includes tracks 48 of carbon loaded polyester ink printed onto opposite sides of an electrically insulating film 50. FIG. 4 illustrates the tracks 48 on one side of the film 50. The tracks on the opposite side of the film are of the same pattern but are offset to lie directly below the spaces 52 between the tracks 48; the tracks are of a width and pitch (for example 250 and 500 microns) that such piercing of the film 50 at any point results in damage to at least one of the tracks. The tracks are connected in series to define one or more conductors and are connected via lines 54 (FIG. 3) to the enclosure monitor 16, which monitors the resistance of the lines. Detection of an increase in resistance, caused by cutting of one of the tracks will cause the information stored on the encryption module 12 to be erased. Providing the tracks 48 in a sawtooth pattern makes it more difficult to cut the film 50 without detection as a slot of any length cut in the film 50 would be sure to cut at least one track 48. Also, it is very difficult to determine the direction of the tracks at any one point on the layer and thus select a suitable slot direction.

The various elements of the laminate 32 are adhered together and then folded around the metal enclosure 24, in a similar manner to a gift wrapping or parcel, to define the inner enclosure 26. Adhesive is provided to retain the folded and overlapping portions in place. The folded laminate 32 is arranged such that the lines forming part of the matrix 34 on one side of the film 36 are exposed on the outer surface of the enclosure 26. A thin layer of adhesive, blackened with a light loading of carbon, is applied to the enclosure 26 and conceals the lines. The enclosure 26 is located within a mould, which is then filled with cold pour polyurethane. The polyurethane is then cured and hardened to form the outer enclosure 28. The resulting moulding is opaque and preferably has a thickness of around 2–5 mm. In this example, the outer enclosure 28 completely encapsulates the inner enclosure 26 providing a complete environmental seal, and thus protecting the interior of the enclosure from damp, dust and the like. During the moulding operation, the uncured, liquid polyurethane flows into any gaps or spaces that may have been left after folding the laminate 32. Further, the hardened polyurethane is resilient, having a shore hardness of 70, and thus provides an enclosure which is robust in normal use.

The outer enclosure 28 provides added security for the enclosure in a number of ways, as will be described below. The normal variances in the thickness of the enclosure 28 result in the position of the inner enclosure within the moulding varying slightly for each enclosure produced. Accordingly, even after examination of a similar enclosure, it is not possible to determine with any accuracy the location of an inner enclosure 26 relative to the moulding 28 in another enclosure. Also, as the liquid polyurethane will have flowed into any gaps or voids in the inner enclosure 26, the possibility of potential weak spots arising is minimised. The outer moulding 28 adheres firmly to the inner enclosure 26 and by appropriate selection of materials is chemically bonded to the enclosure 26 after curing. Further, in the above described example, the adhesion between the moulding 28 and the lines of the matrix 34 is greater than the adhesion of the lines to the film 36. This is achieved by providing a low tensile strength layer between the lines and the film 36. Such a layer may be formed of an ethylvinyl acetate (EVA) having a high vinyl acetate (VA) content and also filled to 45–60% (by weight EVA) with fumed silica. Detailed descriptions of appropriate preferred layer configurations are set out in GB 2 256 958 A. Accordingly, if an attempt is made to peel the moulding from the inner enclosure 26, the lines of the matrix 34 are pulled from the film 36 and broken, providing an indication of tampering. It is envisaged that solvents might be used in an attempt to remove portions of the outer enclosure 28, though the solvents necessary to dissolve the enclosure 28 would, by necessity, have to be very aggressive, and would readily be detected by the inner enclosure 26.

The use of a potting or moulding operation also allows the production of an enclosure 10 with smooth, consistent outer dimensions with no exposed delicate flaps or edges. Also, tamper evident patterns, logos, warnings or user information may easily be moulded into the outer surface of the enclosure 10. Further, the colour of the outer enclosure 28 may be selected to suit particular applications.

Figure 5:
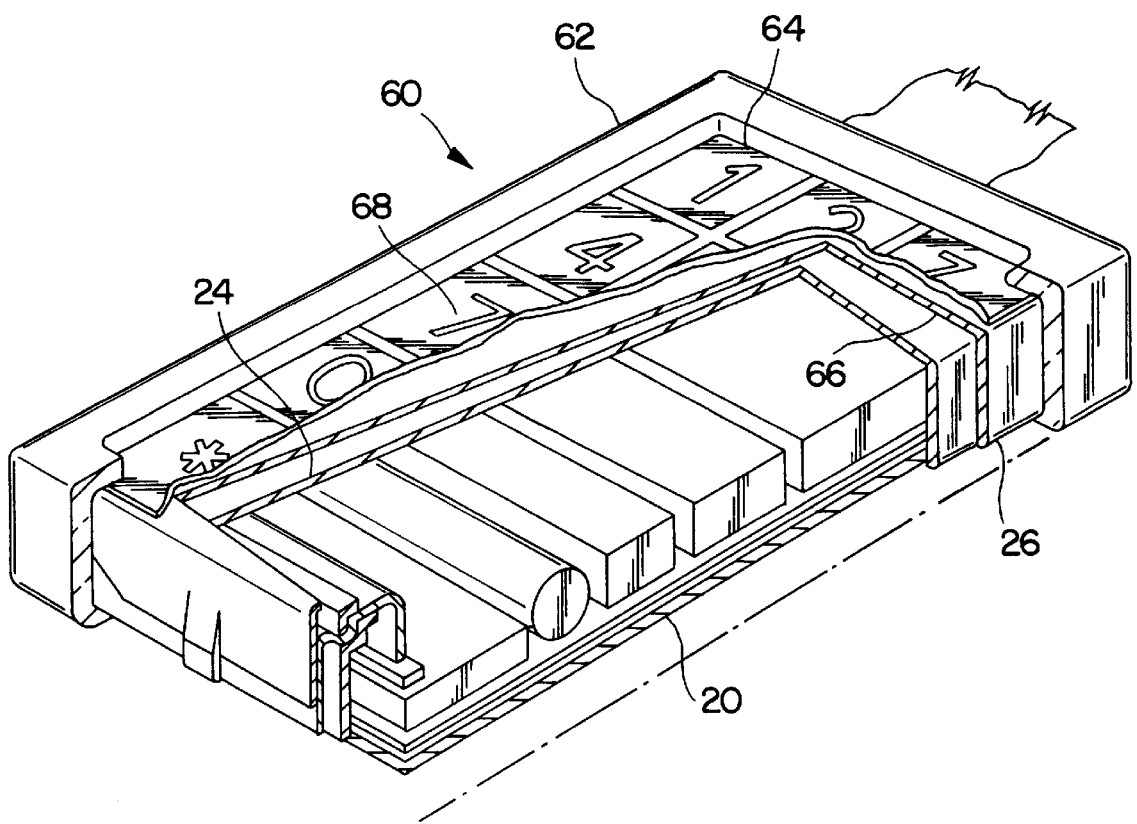
FIG. 5 is a perspective part cut-away view of a tamper respondent enclosure in accordance with a further embodiment of the present invention.

An example of a further tamper respondent enclosure is shown in FIG. 5 of the drawings. Similar features of the enclosures 10 and 60 are designated using the same reference numerals. However, this enclosure 60 differs from the enclosure 10 described above in that the outer enclosure 62 does not completely encapsulate the inner enclosure 26, but includes a window 64 which accommodates a keypad. The touch sensitive portion of the keypad 66 is provided inside the inner enclosure 26, while a printed protected cover layer 68 is provided on the exterior of the enclosure 26. This form of enclosure may be utilised, for example, to control operation of a combination door lock; if tampering is detected, an alarm may be activated. The provision of the resilient outer moulding 62 allows the enclosure 60 to be clamped or otherwise secured to a supporting wall without providing additional protection for the enclosure. Alternatively, mounting lugs may be easily moulded in the cover 62 during manufacture.

It will be evident from the above description that the disclosed enclosures provides a level of security at least as high as that provided by the enclosures in our various prior patent applications, but which are likely to be more easily and reliably produced.

It will be clear to those of skill in the art that the above described embodiments are merely exemplary of the present invention, and that various modifications and improvements may be made thereto without departing from the scope of the invention.

I claim:

1. A method of producing a tamper respondent enclosure comprising the steps of:

provided a sheet of flexible material incorporating tamper respondent means including a delamination respondent layer on at least one side thereof;

folding the sheet and overlapping the edges thereof to define an inner enclosure with the delamination respondent layer presented on the outer surface thereof;

surrounding the inner enclosure with a layer of fluid material; and hardening the fluid material to provide a solid outer enclosure adhered to the inner enclosure.

2. A method of producing a tamper respondent enclosure comprising the steps of:

providing a sheet of flexible material incorporating tamper respondent means including a delamination respondent layer on at least one side thereof;

folding the sheet and overlapping the edges thereof to define an inner enclosure with the delamination respondent layer presented on an outer surface thereof;

surrounding the inner enclosure with a layer of fluid material; and hardening the fluid material to provide a solid outer enclosure adhered to the inner enclosure the fluid material being initially contained in a mold around the inner enclosure.

3. A method of producing a tamper respondent enclosure comprising the steps of:

providing a sheet of flexible material incorporating tamper respondent means including a delamination respondent layer on at least one side thereof;

folding the sheet and overlapping the edges thereof to define an inner enclosure with the delamination respondent layer presented on an outer surface thereof;

surrounding the inner enclosure with a layer of fluid material; and hardening the fluid material to provide a solid outer enclosure adhered to the inner enclosure, The fluid material being initially contained in a mold around the inner enclosure and a window being formed in the outer enclosure during molding.

4. A method of producing a tamper respondent enclosure comprising the steps of:

providing a sheet of flexible material incorporating a tamper respondent means including a delamination respondent layer on at least one side thereof;

folding the sheet and overlapping the edges thereof to define an inner enclosure with the delamination respondent layer presented on the outer surface thereof;

surrounding the inner enclosure with a layer of fluid material; and hardening the fluid material to provide a solid outer enclosure adhered to the inner enclosure, the fluid material being initially contained in a mold around the inner enclosure, and mounting lugs being formed in the outer enclosure during molding.

5. The method of claim 2, in which a tamper evident pattern is formed in the outer surface of the enclosure during molding.

6. The method of claim 1, in which the fluid material is selected to harden at a relatively low temperature, to minimize the possibility of heat damage to the inner enclosure and articles contained within the enclosure.

7. The method of claim 1, in which the fluid material is a cold pour polyurethane system.

8. The method of claim 1, in which the fluid material is selected such that the outer enclosure is resilient on hardening.

9. The method of claim 1, in which an adhesive bond is formed between the outer surface of the inner enclosure and the outer enclosure on curing of the fluid material, and the adhesive bond formed between elements of the delamination respondent layer and the outer enclosure is greater than the adhesive between said elements of the delamination respondent layer and the flexible sheet.

10. The method of claim 9, in which the delamination respondent layer includes a line of electrically responsive material.

11. A tamper respondent enclosure comprising:

a sheet of flexible material incorporating tamper respondent means including a delamination respondent layer on at least one side thereof, the sheet being folded and the edges of the sheet overlapped to define an inner enclosure and to present the delamination respondent layer on the outer surface thereof; and a unitary outer enclosure adhered to and encapsulating the inner enclosure.

12. The enclosure of claim 11, in which outer enclosure extends into any gaps and spaces between overlapping portions of the folded sheet.

13. The enclosure of claim 11, in which the outer enclosure is sufficiently thick and opaque to conceal the location of the folds and seams of the inner enclosure, and also to conceal the exact location of the inner enclosure within the outer enclosure.

14. A tamper respondent enclosure comprising:

a sheet of flexible material incorporating tamper respondent means including a delamination respondent layer on at least one side thereof, the sheet being folded and the edges of the sheet overlapped to define an inner enclosure and to present the delamination respondent layer on an outer surface thereof; and a unitary outer enclosure adhered to and encapsulating the inner enclosure a window being provided in the outer enclosure.

15. The enclosure of claim 11, in which a tamper evident pattern is provided in the outer surface of the enclosure.

16. The enclosure of claim 11, in which the outer enclosure is resilient.

17. The enclosure of claim 11, in which a chemical bond is provided between the outer surface of the inner enclosure and the outer enclosure.

18. The enclosure of claim 11, in which the adhesion between elements of the delamination respondent layer and the outer enclosure is greater than the adhesion between said elements of the delamination respondent layer and the flexible sheet.

19. The enclosure of claim 11, in which the delamination respondent layer includes a line of electrically responsive material, the enclosure further including means for monitoring an electrical characteristic of the line.

20. The enclosure of claim 19, in which connection members are provided between the monitoring means and the line at an edge portion of the sheet provided with connecting locations for the line, and the connection members extend parallel to said edge.

21. A tamper respondent enclosure comprising:

a sheet of flexible material incorporating tamper respondent means including a delamination respondent layer on at least one side thereof, the sheet being folded and the edges of the sheet overlapped to define an inner enclosure and to present the delamination respondent layer on an outer surface thereof; and a unitary outer enclosure adhered to and encapsulating the inner enclosure, the flexible sheet including a laser and pierce respondent layer including tracks of electrically responsive material on opposite sides of an electrically insulating film, each track being nonrectilinear.

22. A tamper respondent enclosure having a wall including a laser and pierce respondent layer including nonrectilinear tracks of electrically responsive material on opposite sides of an electrically insulating sheet, the tracks on opposite sides of the sheet being arranged such that a portion of track covers at least one side of the sheet over the entire area extent of the sheet, and means for monitoring an electrical characteristic of the tracks, an attempt to penetrate any part of the layer resulting in one or more of the tracks being damaged to produce a detectable change in a monitored electrical characteristic of the track.

23. A method of producing a tamper respondence enclosure comprising the steps of:

provided a sheet of flexible material incorporating tamper respondent means including a delamination respondent layer on at least one side thereof;

folding the sheet and overlapping the edges thereof to define an inner enclosure with the delamination respondent layer presented on the outer surface thereof;

surrounding the inner enclosure with a layer of fluid material, leaving a portion of the inner enclosure free of said fluid material, and hardening the fluid material to provide a solid outer enclosure adhered to the inner enclosure and provided with a window at said portion of the inner enclosure.

24. A tamper respondent enclosure comprising:

a sheet of flexible material incorporating tamper respondent means including a delamination respondent layer on at least one side thereof, the sheet being folded and the edges of the sheet overlapped to define an inner enclosure and to present the delamination respondent layer on the outer surface thereof, and a molded unitary outer enclosure adhered to and surrounding the inner enclosure and defining a window permitting limited access to the inner enclosure.

25. A tamper respondent enclosure comprising:

a sheet of flexible material incorporating tamper respondent means including a delamination respondent layer on at least one side thereof, the sheet being folded and the edges of the sheet overlapped to define an inner enclosure and to present the delamination respondent layer on the outer surface thereof; and a molded unitary outer enclosure adhered to and encapsulating the inner enclosure.

* * * * *